United States Patent
Wong et al.

(10) Patent No.: US 6,809,606 B2
(45) Date of Patent: Oct. 26, 2004

(54) VOLTAGE ID BASED FREQUENCY CONTROL FOR CLOCK GENERATING CIRCUIT

(75) Inventors: Keng L. Wong, Portland, OR (US); Hong-Piao Ma, Portland, OR (US); Greg F. Taylor, Portland, OR (US); Chee How Lim, Hillsboro, OR (US); Robert Greiner, Beaverton, OR (US); Edward A. Burton, Hillsboro, OR (US); Douglas R. Huard, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 10/136,321

(22) Filed: May 2, 2002

(65) Prior Publication Data

US 2003/0206071 A1 Nov. 6, 2003

(51) Int. Cl.$^7$ .................................................. H03L 1/00
(52) U.S. Cl. .......................... 331/175; 331/176; 331/185
(58) Field of Search ..................... 331/185, 175, 331/176; 327/564, 565, 156, 159, 291, 295, 296; 326/101

(56) References Cited

U.S. PATENT DOCUMENTS

| | | | |
|---|---|---|---|
| 5,239,274 A | | 8/1993 | Chi |
| 5,384,551 A | * | 1/1995 | Kennedy et al. ............... 331/17 |
| 5,420,544 A | | 5/1995 | Ishibashi |
| 5,565,816 A | | 10/1996 | Coteus |
| 5,642,058 A | | 6/1997 | Trimberger et al. |
| 5,751,194 A | * | 5/1998 | Haapanen et al. ............. 331/17 |
| 5,764,710 A | | 6/1998 | Cheng et al. |
| 5,796,992 A | | 8/1998 | Reif et al. |
| 5,838,179 A | * | 11/1998 | Schmidt ....................... 327/156 |
| 5,856,766 A | * | 1/1999 | Gillig et al. .................. 331/176 |
| 5,912,574 A | * | 6/1999 | Bhagwan ..................... 327/157 |
| 5,959,502 A | * | 9/1999 | Ovens et al. ................... 331/8 |
| 5,999,025 A | | 12/1999 | New |
| 6,043,718 A | * | 3/2000 | Diniz et al. .................... 331/57 |
| 6,047,248 A | * | 4/2000 | Georgiou et al. ............ 702/132 |
| 6,078,634 A | * | 6/2000 | Bosshart ....................... 375/376 |
| 6,140,883 A | | 10/2000 | Thomas |
| 6,163,224 A | * | 12/2000 | Araki et al. ................... 331/34 |
| 6,188,252 B1 | | 2/2001 | Kawakami |
| 6,201,448 B1 | | 3/2001 | Tam et al. |
| 6,208,169 B1 | | 3/2001 | Wong et al. |
| 6,268,749 B1 | | 7/2001 | Fisch et al. |
| 6,298,450 B1 | | 10/2001 | Liu et al. |
| 6,310,792 B1 | | 10/2001 | Drobnik |
| 6,441,660 B1 | * | 8/2002 | Ingino, Jr. ................... 327/156 |
| 6,504,438 B1 | * | 1/2003 | Ching et al. .................. 331/17 |
| 6,753,739 B1 | * | 6/2004 | Mar et al. .................... 331/176 |

OTHER PUBLICATIONS

Gyu Moon et al., "A New GHZ CMOS CellularOscillator Network", 1998 IEEE, pp. II–89–92.
U.S. patent application Ser. No. 10/136,321.
U.S. patent application Ser. No. 10/136,390.
U.S. patent application Ser. No. 10/136,318.
U.S. patent application Ser. No. 10/136,474.

* cited by examiner

Primary Examiner—Timothy P. Callahan
Assistant Examiner—An T. Luu
(74) Attorney, Agent, or Firm—Blakely, Sokoloff, Taylor & Zafman LLP

(57) ABSTRACT

An apparatus and method are provided for operating a processor core. This may include a first circuit to operate at a frequency that is dependent on a power supply voltage. A frequency control circuit may be provided to control a frequency of the first circuit by directing a voltage regulator to increase or decrease the power supply voltage.

12 Claims, 10 Drawing Sheets

VOLTAGE ID BASED FREQUENCY CONTROL FOR CLOCK GENERATING CIRCUIT

FIELD

The present invention relates generally to microprocessor circuits, and more specifically to internal clocks in microprocessor.

BACKGROUND

Electronic devices, such as microprocessors, are steadily operating at faster and faster speeds. As microprocessors run at higher and higher speeds, the power delivered to the microprocessors by a power supply starts to become an issue. Voltage drops (or droops) may occur as power is delivered from a power source to individual components and devices on the die of a microprocessor. For example, devices on a die may receive only 1.0 volt from a power source that is supplying 1.2 volts due to a voltage droop. Decoupling capacitors may be used on a die to help reduce voltage droop. However, decoupling capacitors cost area on the die and also cost power due to gate oxide leakage.

Power source voltage droops affect the speed at which an electronic device (e.g., microprocessor or integrated circuit) may operate. During normal operation of a microprocessor (or any sequential machine), noise may be generated from instantaneous switching. Voltage supply noise modulates the delay of data paths. Voltage droops reduce the maximum frequency of operation of the microprocessor. For example, as a voltage droop magnitude increases, the operating frequency of the microprocessor decreases. Thus, a large change in processor activity may cause substantial supply voltage transients resulting in performance loss.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example arrangements and embodiments of the invention, it should be clearly understood that the same is by way of illustration and example only and that the arrangements and embodiments are not limited thereto.

The following represents brief descriptions of the drawings in which like reference numerals represent like elements and wherein.

DETAILED DESCRIPTION

Figure 1:
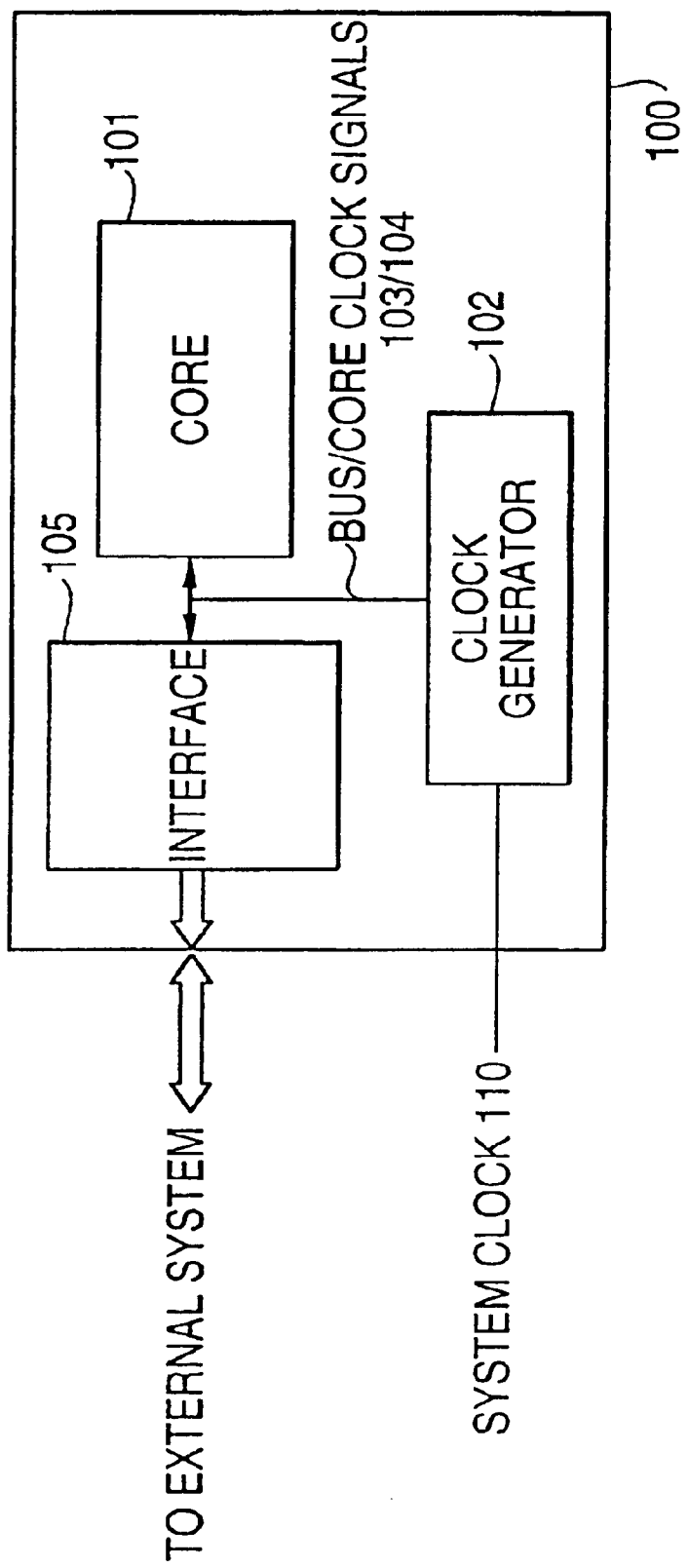
FIG. 1 is a block diagram of an integrated circuit according to one arrangement.

In the following detailed description, like reference numerals and characters may be used to designate identical, corresponding or similar components in differing figure drawings. Further, in the detailed description to follow, example values may be given, although embodiments of the present invention are not limited to the same. While values may be described as HIGH or LOW, these descriptions of HIGH and LOW are intended to be relative to the discussed arrangement and/or embodiment. That is, a value may be described as HIGH in one arrangement although it may be LOW if provided in another arrangement. Arrangements and embodiments may be shown in block diagram form in order to avoid obscuring the invention, and also in view of the fact that specifics with respect to implementation of such block diagram arrangements and embodiments may be highly dependent upon the platform within which the present invention is to be implemented. That is, such specifics should be well within the purview of one skilled in the art. Where specific details (e.g., circuits) are set forth in order to describe example embodiments of the invention, it should be apparent to one skilled in the art that the invention can be practiced without, or with variation of, these specific details. It should also be apparent that differing combinations of hard-wired circuitry may be used to implement embodiments of the present invention. That is, embodiments of the present invention are not limited to any specific combination of hardware.

Embodiments of the present invention may also be described with respect to signals being input or output from different circuit components. It is understood that while the discussion identifies a signal, the signal may be transmitted over a signal line or similar type of mechanism. Further, the terminology signal may also correspond to a signal line as shown in the drawings. Well-known power/ground and address connections to components may not be shown within the figures for simplicity of illustration and discussion, and so as not to obscure the invention.

While the following discussion may be presented with respect to implementation in a microprocessor, embodiments of the present invention are not limited to that specific implementation. Implementations for generating clock signals for various digital devices such as integrated circuits, discrete logic devices, memory devices, devices either on the same or separate chips, communications devices, etc., are also within the scope of the present invention.

In order to better describe embodiments of the present invention being pursued in the present patent application, various embodiments and arrangements may initially be described. These initial embodiments may be pursued in related U.S. patent application Ser. No. (Attorney Docket No. 219.41237X00), filed simultaneously with this application.

Embodiments of the present invention may provide a circuit that includes a clock distribution network and a multiplexing device coupled to the clock distribution network to select between a synchronous mode and an asynchronous mode. A plurality of distributed ring oscillators may asynchronously drive the clock distribution network in the asynchronous mode. The distributed ring oscillators may be coupled to a power supply such that they track the critical paths. A phase lock loop circuit (located external to the core circuit) may synchronously drive the clock distribution network in the synchronous mode. In the following discussion, the terminology asynchronously driving the clock distribution network may be used with reference to the asynchronous mode. In the asynchronous mode, the clock distribution network may be driven asynchronously relative to an external clock. The clock distribution network may be synchronously driven although it is asynchronous with respect to an external clock.

Embodiments of the present invention may thereby provide power supply control on a microprocessor. This allows performance to be recovered since the performance may be dependent on the average power supply level rather than minimizing power supply droop. The core clock frequency may instantaneously track the worst-case speedpath over Vcc noise. The instantaneous performance of the processor core may vary over time in response to Vcc transient.

FIG. 1 is a block diagram of an integrated circuit according to one arrangement. Other arrangements are also possible. More specifically, FIG. 1 shows an integrated circuit 100 having a core 101, an interface 105, and a clock generator 102. The core 101 may include circuitry and logic to perform the designated functions of the integrated circuit, while the interface 105 may provide an interface between the core 101 and the remainder of the system and its system bus(es). For instance, if the integrated circuit 100 includes a processor, the core 101 may include one or more decoders, scheduling logic, execution units, reorder buffers, memory order buffers, register files, cache memory, etc., for use in executing instructions. The interface 105 may include external bus controller logic and programmable interrupt controller logic.

The clock generator 102 may generate the clock signals in response to a system clock signal 110. The clock generator 102 may include a phase lock loop (PLL) circuit. The clock signals may be coupled to the core 101 and the interface 105. The clock generator 102 may generate the bus clock signal (s) 103 and the core clock signal(s) 104.

Figure 2:
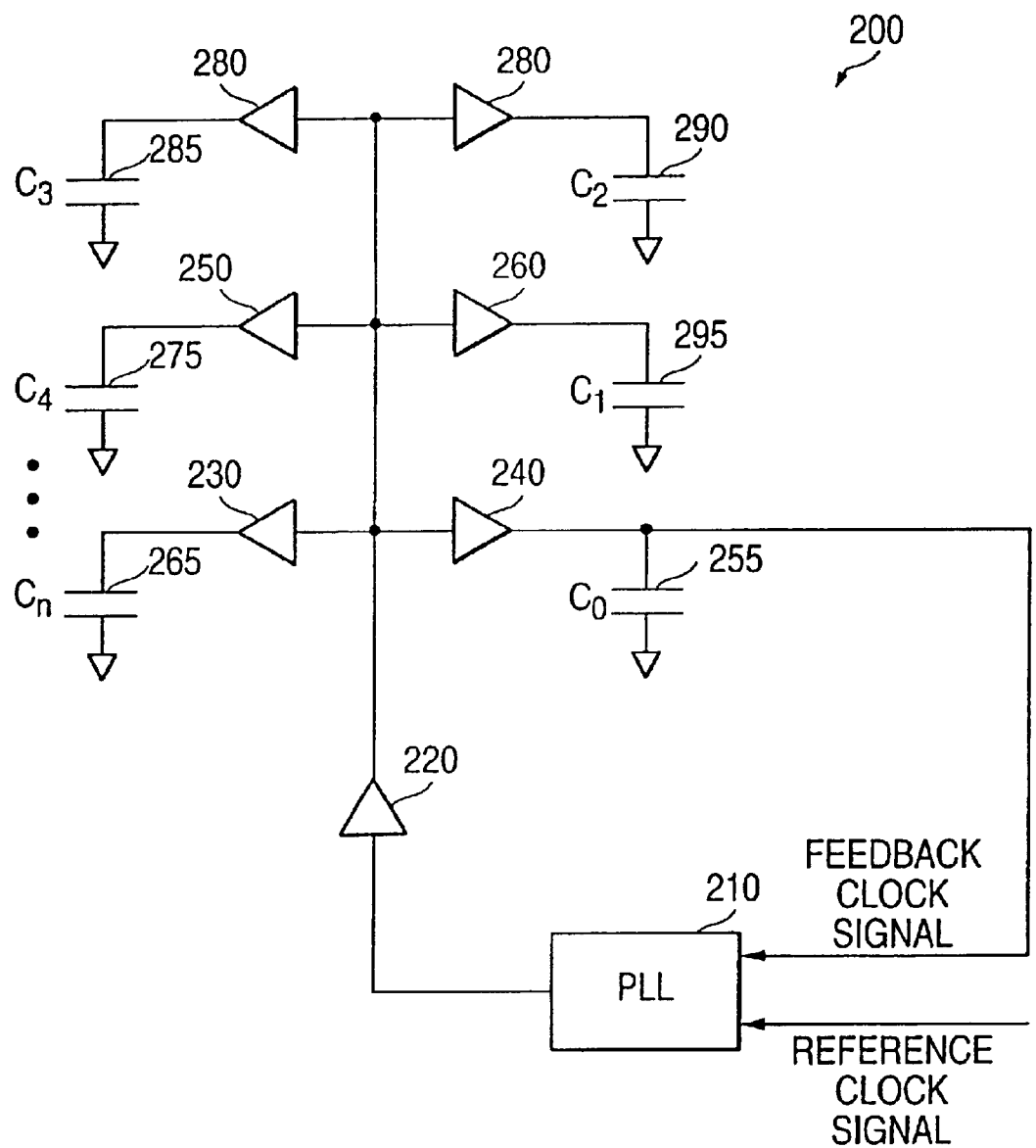
FIG. 2 is a schematic diagram of a clock distribution network according to one arrangement.

FIG. 2 illustrates a clock distribution network 200 according to one arrangement. Other arrangements are also possible. The clock distribution network 200 distributes a clock signal to chip components such as the core 101 (shown in FIG. 1). As illustrated, a feedback clock signal and a reference clock signal may be applied to a PLL 210, which may be provided within the clock generator 102. The clock distribution network 200 may include a plurality of drivers 220, 230, 240, 250, 260, 270 and 280 to drive large capacitances, such as attributable to registers and latches, with the output signal of the voltage-controlled oscillator of the phase lock loop (PLL). The drivers 220, 230, 240, 250, 260, 270 and 280 may contain inverters (not shown). Hence, the capacitances may be switched at the clock frequency. The capacitances 265, 275, 285, 290, 295 and 255 may be the capacitances attributable to the components of the chip. In addition to these capacitances, the gate capacitances of the driver inverters may also be switched at the clock frequency. If the total capacitance for the clock network is represented as C and the clock network switches at the clock frequency, f, the amount of power dissipated may be represented as $CV^2f$, where V is the supply voltage. This amount of power may be a significant portion of the total power utilized by the chip due to a relatively large C and a relatively high f.

Figure 3:
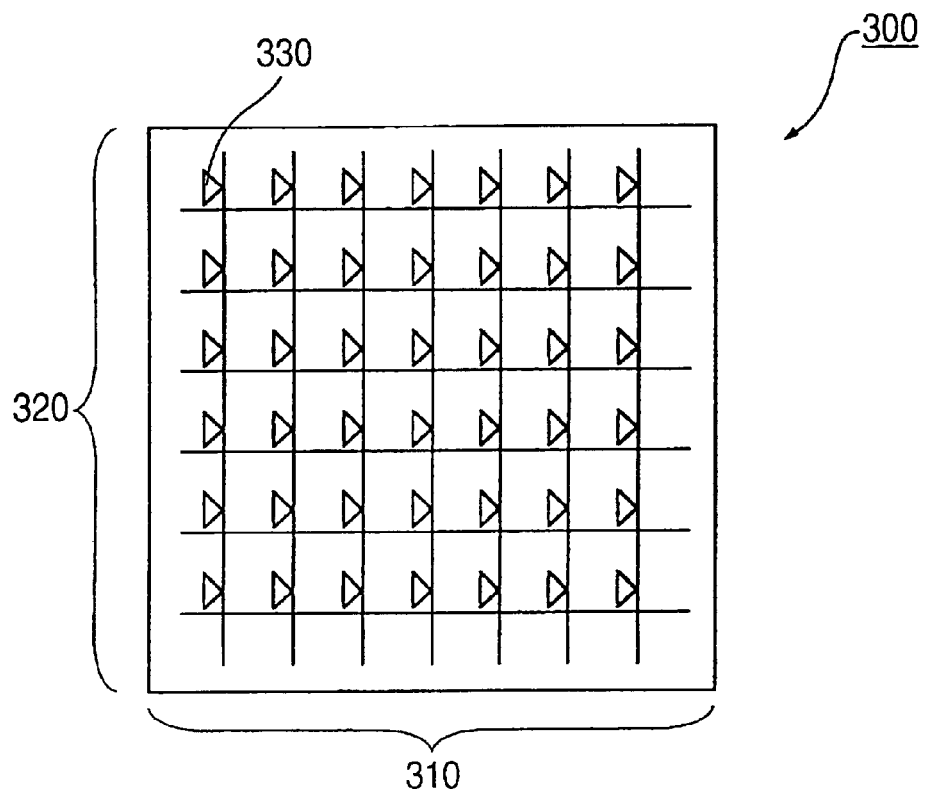
FIG. 3 is a diagram of one stage of a clock distribution network according to one arrangement.

FIG. 3 is a diagram of one stage of a clock distribution network according to one arrangement. Other arrangements are also possible. More specifically, FIG. 3 shows one stage of a clock distribution network 300 that may be provided within the core 101 (FIG. 1). FIG. 3 shows the terminal stage with multiple drivers driving a common and continuous grid. The clock distribution network 300 may also be provided within other entities. The core clock distribution network 300 may include signal traces 310 (shown vertically in the drawing figure) and signal traces 320 (shown horizontally in the drawing figure). The core clock distribution network 300 may also include a plurality of drivers coupled to the signal traces 310 and 320. For ease of illustration, only a first driver 330 is labeled in FIG. 3. The drivers operate to provide clock signals (such as core clock signals) to the clock distribution network 300 and thereby provide clock signals to respective elements (such as latches and registers) of the core 101 (not shown in FIG. 3).

Figure 4:
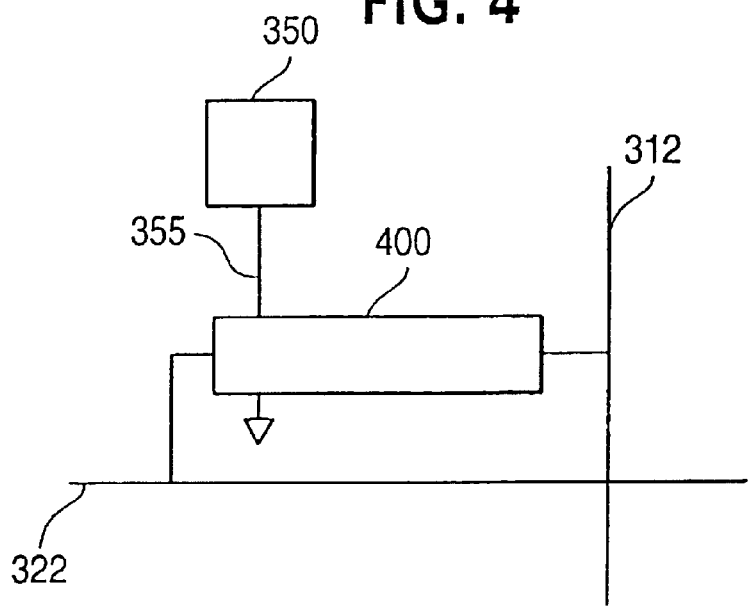
FIG. 4 is a block diagram of a clock generating circuit according to an example embodiment of the present invention.

FIG. 4 is a block diagram of a clock generating circuit according to an example embodiment of the present invention. Other embodiments and configurations are also within the scope of the present invention. In this embodiment, the clock generating circuit may be provided within the core 101 although the clock generating circuit may also be located in other locations that include a clock distribution network. More specifically, FIG. 4 shows a clock generating circuit 400 coupled between a first signal trace 312 and a second signal trace 322. The first signal trace 312 may be one of the signal traces 310 and the second signal trace 322 may be one of the signal traces 320. However, embodiments of the present invention are also applicable to the signal trace 312 and the signal trace 322 being configured into a clock distribution network different from the clock distribution network shown in FIG. 3. FIG. 4 only shows one clock generating circuit although the plurality of clock generating circuits may be distributed throughout the clock distribution network.

FIG. 4 also shows a power supply (or power supply device) 350 provided external to the core 101, such as in a periphery (i.e., the I/O) of the integrated circuit about the core 101 (FIG. 1). The power supply 350 may be coupled by a power distribution network 355 to the clock generating circuit 400. Although not shown in FIG. 4, a plurality of clock generating circuits 400 may be provided about the clock distribution network in a similar manner as each of the drivers provided about the clock distribution network 300 in FIG. 3. In other words, the clock distribution network may include a plurality of clock generating circuits 400 each coupled between signal traces and each powered by the power supply 350 through the power distribution network 355.

Figure 5:
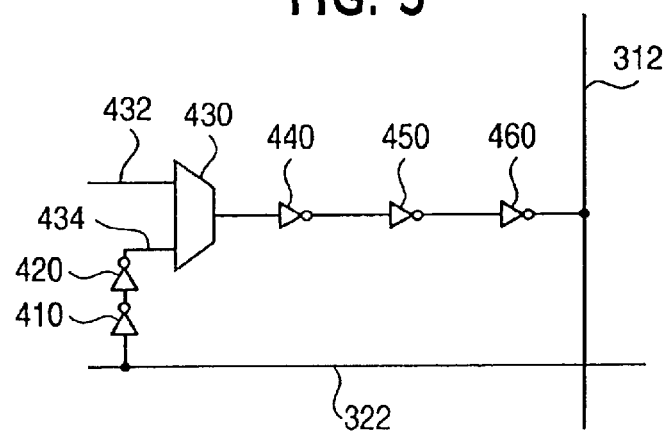
FIG. 5 is a diagram of a clock generating circuit according to an example embodiment of the present invention.

FIG. 5 is a diagram of a clock distribution circuit according to an example embodiment. FIG. 5 shows more specific circuit elements (such as inverter circuits and a multiplexing device) each of which may be powered by the power supply 350 coupled via the power distribution network 355. As shown, a plurality of inverter circuits 410, 420, 440, 450 and 460 and a multiplexing device 430 (or selecting device) may be coupled as a ring oscillator (or ring oscillator circuit) between the signal trace 312 and the signal trace 322. That is, the inverter circuit 410 receives a signal from the signal trace 322. The signal propagates through the inverter circuit 420, through the multiplexing device 430, through the inverter circuits 440, 450 and 460 and is output to the signal trace 312 from the last stage of the ring oscillator (such as the inverter circuit 460). In other words, the input signal to the ring oscillator and the output signal of the ring oscillator are to the clock distribution network.

FIG. 5 shows five stages of a ring oscillator circuit coupled between signal traces. The ring oscillator circuit may include any odd number of stages so as to produce an oscillating circuit between signal traces. That is, while FIG. 5 shows five inverter circuits, embodiments of the present application are also applicable to other numbers of inverter circuits coupled in series so as to produce a ring oscillator circuit. Furthermore, circuit elements other than inverter circuits may also be used to form the ring oscillator.

The multiplexing device (or selecting device) 430 is coupled between the inverter circuit 420 and the inverter circuit 440. The multiplexing device 430 selects between inputs on a signal line 432 and a signal line 434. The multiplexing device 430 may receive an input signal on the signal line 434 from the inverter circuit 420. The multiplexing device 430 may receive input signals on the signal line 432 from a phase lock loop (PLL) circuit provided external to the core 101, for example. That is, the phase lock loop circuit may provide a clock signal along the signal line 432 to the multiplexing device 430.

The multiplexing device 430 may receive a select signal to select between an asynchronous mode and a synchronous mode. In the synchronous mode, the clock signal on the signal line 432 passes through the multiplexing device 430, and subsequently passes through the inverter circuits 440, 450 and 460. The resulting signal is output to the signal trace 312 (i.e., the clock distributing network). This thereby results in the clock distribution network operating based on a synchronous signal provided by the PLL located external to the core 101. On the other hand, the multiplexing device 430 may operate in the asynchronous mode based on the select signal. In the asynchronous mode, the signal on the signal line 434 (from the inverter circuit 420) passes through the multiplexing device 430 and subsequently passes through the inverter circuits 440, 450 and 460. The resulting signal is output to the signal trace 312 (i.e., the clock distribution network). The signal may also propagate back along the signal trace 322 to the inverter circuits 410 and 420 and be subsequently passed through the multiplexing device 430 since the multiplexing device 430 is still operating in the asynchronous mode. Accordingly, the select signal applied to the multiplexing device 430 may operate the clock generating circuit in either a synchronous mode or an asynchronous mode. Although not shown in FIG. 5, each of the clock generating circuits provided about the clock distribution network may include elements (such as inverter circuits and multiplexing devices) similar to the elements shown in FIG. 5. Each of the respective multiplexing devices may separately receive a similar select signal so as to provide the appropriate mode for the entire clock distribution network.

The multiplexing device 430 may be considered part of the ring oscillator. The multiplexing device 430 may be a pass-through element, which makes it logically passive for the loop. However, the multiplexing device 430 may contribute to delay (and therefore period) and Vcc sensitively of the delay of the loop.

Figure 6:
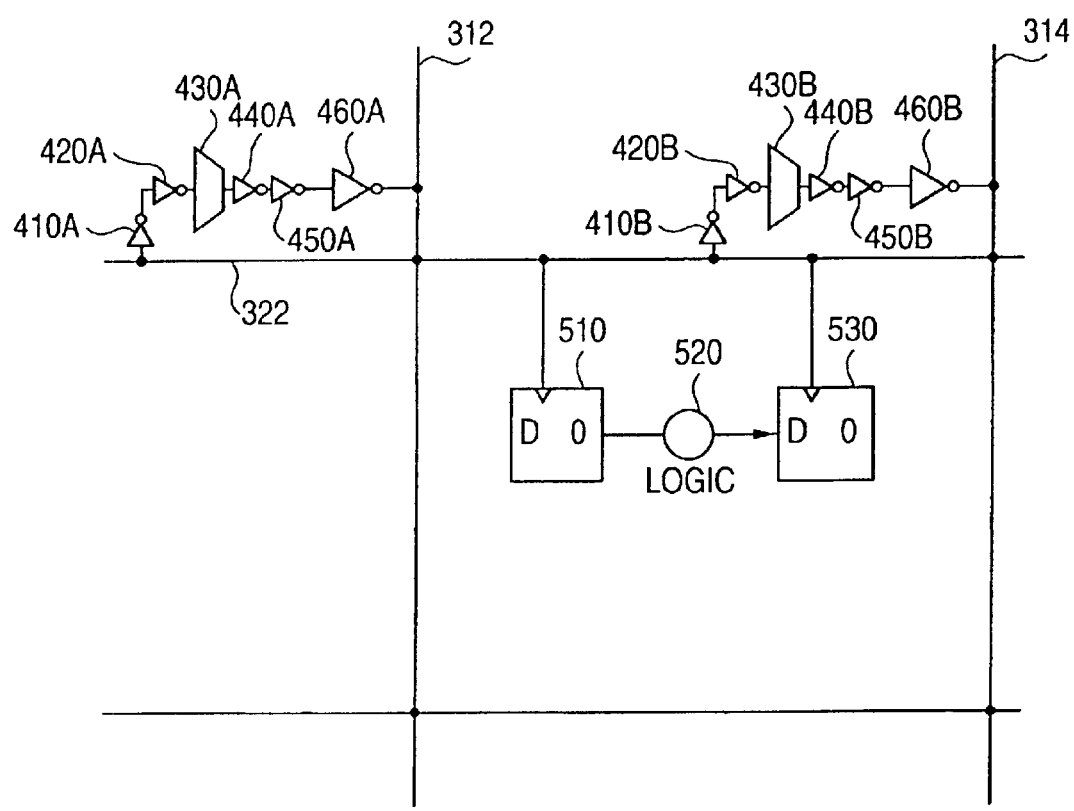
FIG. 6 is a diagram showing the clock generating circuit of FIG. 5 along with elements to be clocked according to an example embodiment of the present invention.

FIG. 6 is a diagram showing the clock generating circuit of FIG. 5 along with elements to be clocked according to an example embodiment of the present invention. Other embodiments and configurations are also within the scope of the present invention. For ease of illustration, FIG. 6 only shows two clock generating circuits, namely a first clock generating circuit (in which the components are labeled A) and a second clock generating circuit (in which the components are labeled B). Both the first clock generating circuit and the second clock generating circuit may be similar to the clock generating circuit shown in FIG. 5 although other embodiments for a clock generating circuit are also within the scope of the present invention.

More specifically, the first clock generating circuit includes inverter circuits 410A, 420A, 440A, 450A and 460A as well as a multiplexing device 430A. Similarly, the second clock generating circuit includes inverter circuits 410B, 420B, 440B, 450B and 460B as well as a multiplexing device 430B. The first clock generating circuit may be coupled between the signal trace 312 and the signal trace 322. The second clock generating device may be coupled between a signal trace 314 (such as one of the signal traces 310) and the signal trace 322. FIG. 6 shows elements of the core 101 such as a D flip-flop circuit 510, logic 520 and a D flip-flop circuit 530. The D flip-flop circuits 510 and 530 may be clocked by the clock distribution network, such as clock signals on the signal trace 322. The logic 520 may include any type of latch, mechanism or state machine to perform a desired function in the core 101.

Figure 7:
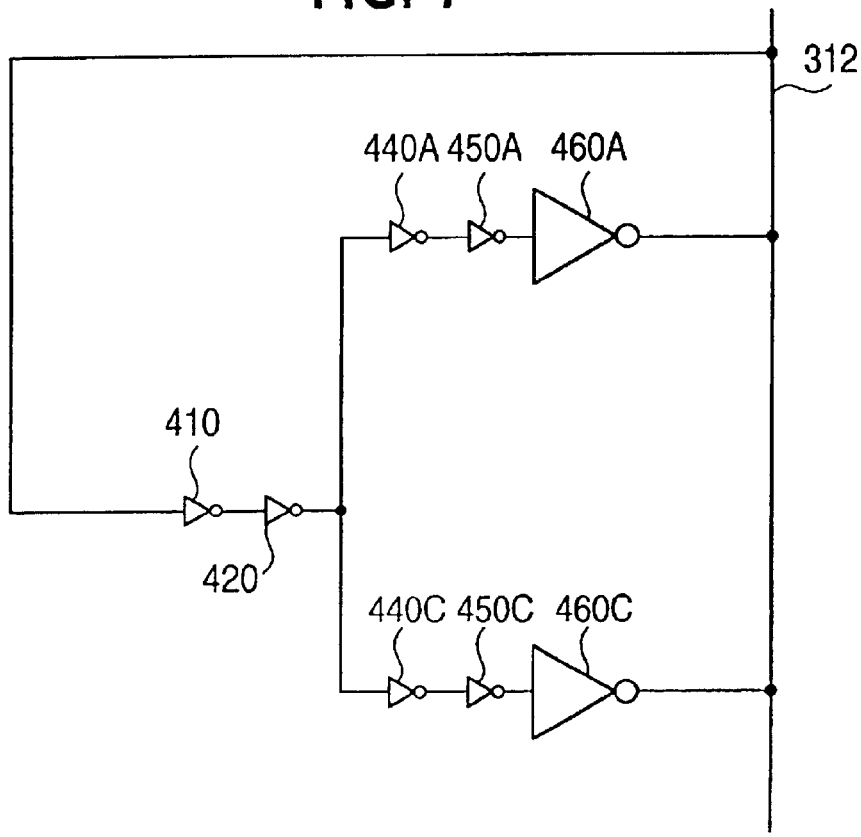
FIG. 7 is a diagram of a clock generating circuit according to an example embodiment of the present invention.

FIG. 7 is a diagram of a clock generating circuit according to an example embodiment of the present invention. Other embodiments and configurations are also within the scope of the present invention. In this embodiment, portions of the ring oscillator may be shared between a first clock generating circuit and a second clock generating circuit. More specifically, the inverter circuits 410 and 420 may be commonly used for both a first clock generating circuit (formed by at least the inverter circuits 440A, 450A and 460A) and a second clock generating circuit (formed by at least inverter circuits 440C, 450C and 460C). For ease of illustration, the multiplexing device for use in the ring oscillator is not shown in FIG. 7 although the multiplexing device may be provided after the inverter circuit 420 in one embodiment. The first clock generating circuit may output a clock signal on the signal trace 312 and the second clock generating circuit may output a clock signal on the signal trace 312.

Figure 8:
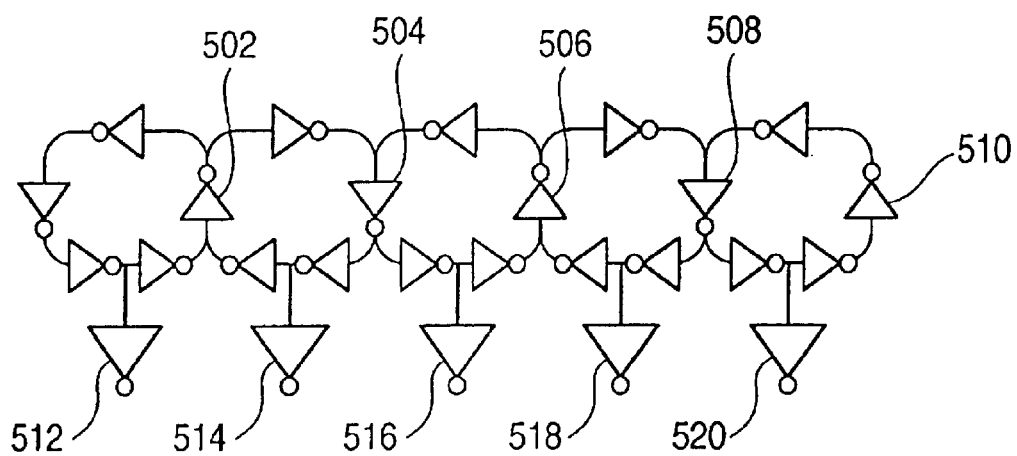
FIG. 8 is a diagram of a clock generating circuit according to an example embodiment of the present invention.

FIG. 8 is a diagram of a clock generating circuit according to another example embodiment of the present invention. Other embodiments and configurations are also within the scope of the present invention. In this embodiment, elements of the ring oscillator may be shared between clock generating circuits. In this embodiment, adjacent ring oscillators may be "horizontally" coupled to share elements such as inverter circuits. For example, each of inverter circuits 502, 504, 506, 508 and 510 are shared between adjacent ring oscillators. This may help reduce wire delays. The clock signals may be output from the last stage of each ring oscillator circuit to a signal trace such as the signal trace 322. In this example, inverter circuits 512, 514, 516, 518 and 520 are the last stage of each ring oscillator. Although not shown in FIG. 8, multiplexing devices may be provided prior to the last inverter circuit of each ring oscillator circuit.

Figure 9:
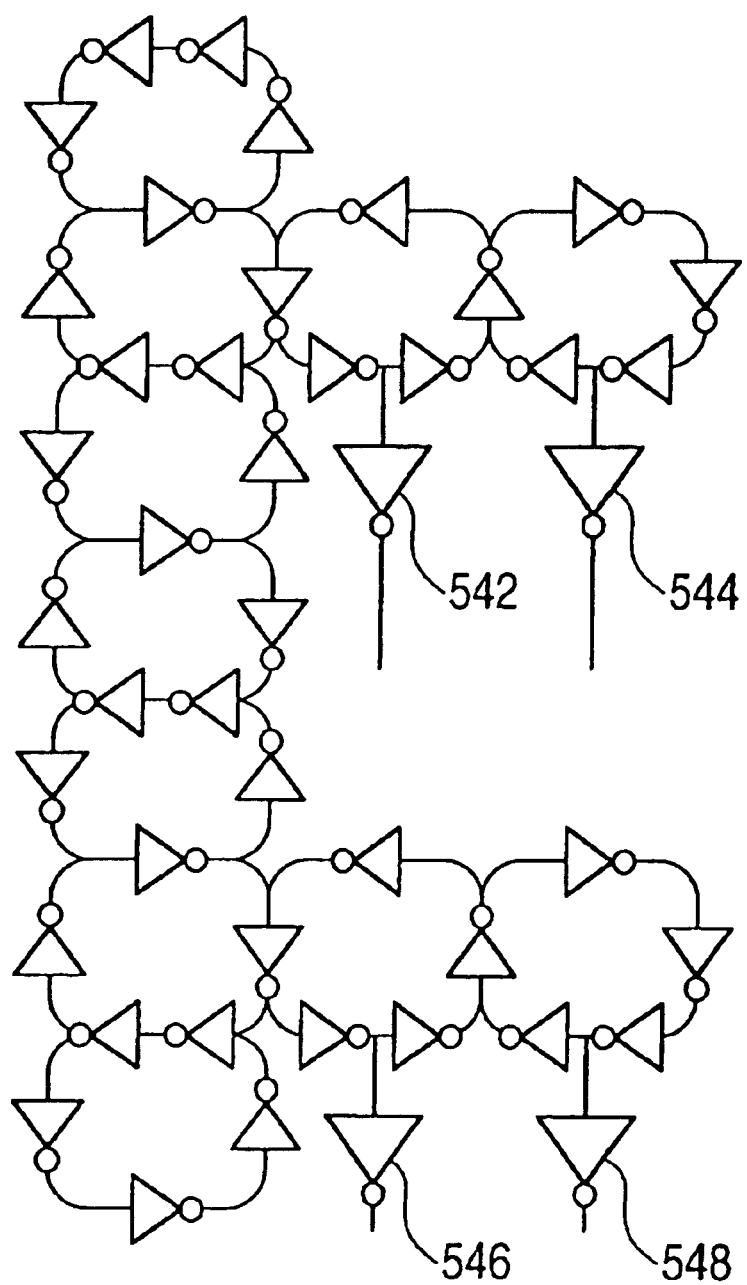
FIG. 9 is a diagram of a clock generating circuit according to an example embodiment of the present invention.

FIG. 9 is a diagram of a clock generating circuit according to another example embodiment of the present invention. Other embodiments and configurations are also within the scope of the present invention. In this embodiment, elements of the ring oscillators may be shared between clock generating circuits. In this embodiment, adjacent ring oscillators may be "horizontally" coupled to share elements. Ring oscillators may also be "vertically" coupled to share elements. The clock signals may be output from the last stage of the ring oscillator circuits to different signal traces. In this example, inverter circuits 542, 544, 546 and 548 are the last stage of each ring oscillator. Although not shown in FIG. 9, multiplexing devices may be provided prior to the last inverter circuit of each ring oscillator circuit.

As discussed above, the synchronous mode's signal may originate from a phase lock loop circuit located external from the core and be distributed within the clock distribution network. On the other hand, the asynchronous mode's signal may originate from itself. In a stopped state, all the ring oscillators may be de-asserted by an enable signal to one of the oscillator stages, which may be a NAND gate, for example. When an enable input is asserted high, then oscillation may begin. The enable signal to all the oscillators may be asserted simultaneously to start all the oscillators together.

Figure 10:
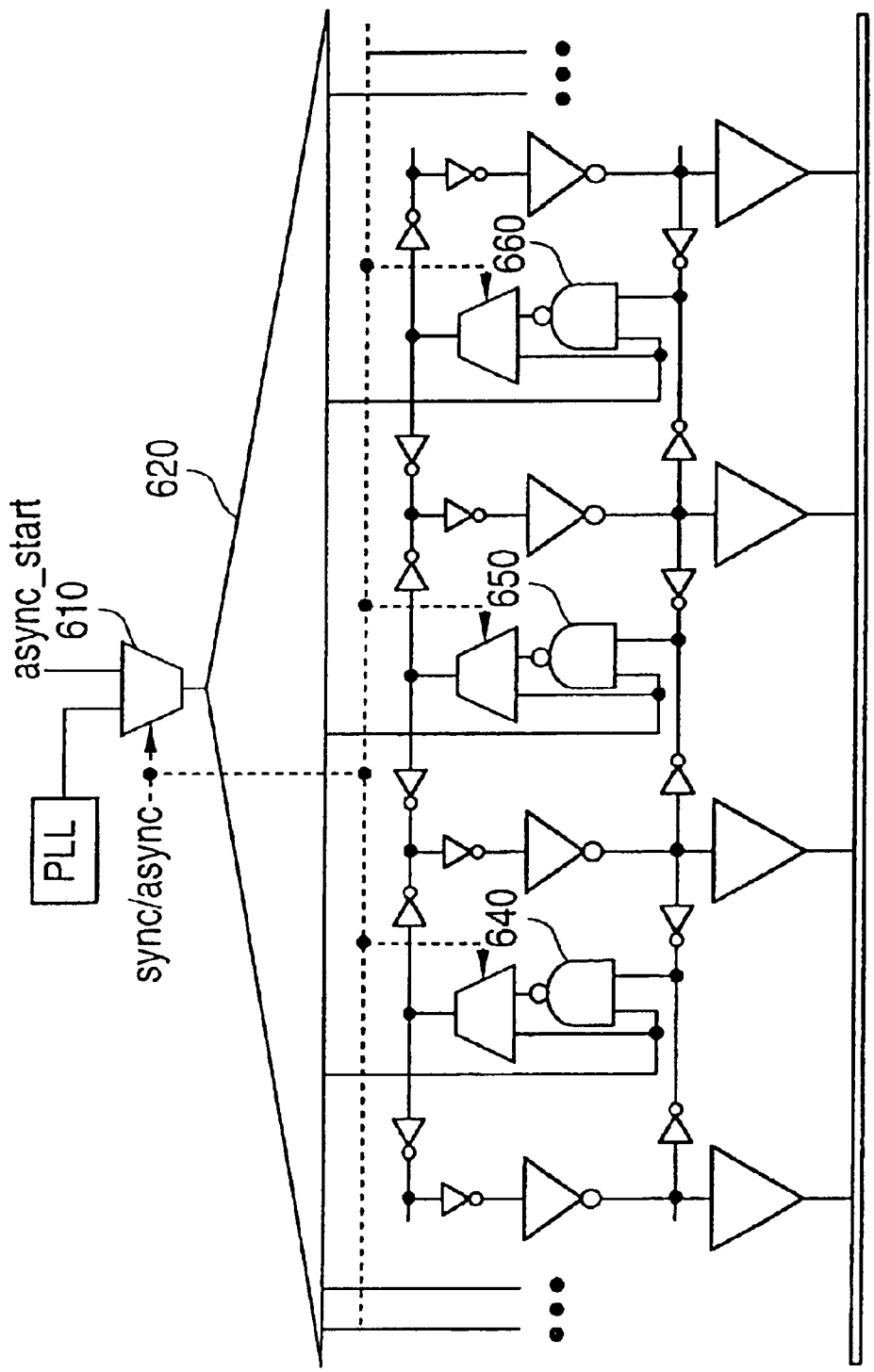
FIG. 10 is a diagram of a start/stop circuit according to an example embodiment of the present invention.

More specifically, FIG. 10 shows a start/stop circuit according to an example embodiment of the present invention. Other embodiments and configurations are also within the scope of the present invention. The start/stop circuit operates to start driving the clock distribution network and to stop driving the clock distribution network. FIG. 10 shows a multiplexing device 610 to select between a synchronous mode and an asynchronous mode based on a synchronous/asynchronous select signal, which is also used as the select signal for the multiplexing device of each of the ring oscillator circuits. FIG. 10 also shows portions of the clock distribution network 620 (such as respective signal traces) coupled to inputs of NAND gates 640, 650 and 660. Other inputs to the NAND gates 640, 650 and 660 may be from signal lines between stages of each ring oscillator circuit. The output of each of the NAND gates 640, 650 and 660 is to one input of the multiplexing device (such as the multiplexing device 430) of each ring oscillator circuit. Accordingly, the circuit shown in FIG. 10 provides start/stop capabilities in the asynchronous mode.

In the synchronous mode, the PLL may drive the clock distribution network, and the core clock. When the asynchronous mode is selected, then the clock distribution network may be driven by the asynchronous start signal (shown as async_start), which is initially low and thus the core clock may be stopped. The async_start signal may be asserted to start the asynchronous mode oscillator. Since this signal travels down the clock distribution network, a simultaneous start may occur. This may be the same for subsequent stops/starts.

Figure 11:
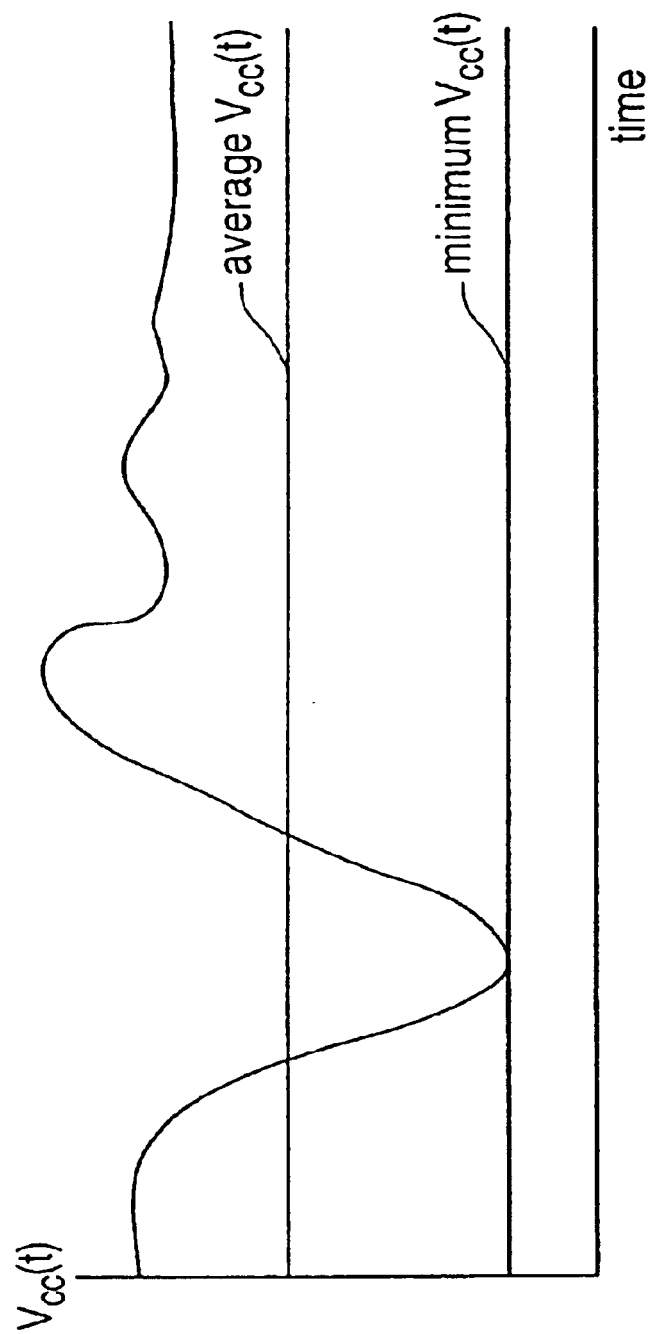
FIG. 11 is a graph showing a Vcc voltage signal that varies due to noise.

FIG. 11 is a graph showing the Vcc voltage signal on a die. As shown, the Vcc signal may vary due to reasons such as noise. The noise may impart Vcc modulation with peaks and valleys. FIG. 11 also shows a minimum Vcc(t) value that is located at a value no greater than the largest valley of the Vcc signal. In this arrangement, the frequency of the core would be at the lowest Vcc droop. Embodiments of the present invention allow the die to operate at an average Vcc(t) value. That is, the frequency of the core may track Vcc instantaneously. As clearly shown in FIG. 11, the average Vcc(t) value is higher than the minimum Vcc(t) value. This allows the performance to be based on the average power supply level rather than the minimum power supply level. This also reduces the need to minimize the power supply droop as in disadvantageous and costly arrangements.

Embodiments of the present invention have been described with regard to a method and apparatus to couple a core frequency to an instantaneous power supply such that the core frequency tracks the power supply (Vcc) to maintain functionality of the core logic in the face of severe supply noise. Embodiments of the present invention may include distributed oscillators to drive a common clock distribution network. The distributed oscillators may filter out the uncorrelated noise and respond to global supply noise. Embodiments of the present invention may further provide an asynchronous core I/O interface flexible enough to allow a wide range of instantaneous frequency ratios between the core and the I/O. An I/O ring around the core may run on a phase lock loop circuit synchronizing the I/O to the external world and thereby presenting a synchronous interface to the outside. An internal core phase lock loop circuit may drive the internal core clock in a synchronous mode to facilitate testing.

Embodiments of the present invention may provide a clock distribution network driven by a regular array of identical oscillators. This uniform structure may ensure that all the oscillators toggle simultaneously to produce a clock that reaches any point on the die at a coherent frequency with minimal skew between points. Each oscillator may include a ring oscillator made out of an odd number of inversion stages. These stages may be CMOS technology so that the elements of the ring oscillator track the power supply and temperature in the same fashion as the core datapath logic. The ring oscillator length may also be adjustable. The ring oscillator may be adjusted to a length that produces a period just long enough to ensure functionality of the worst-case core speedpath under any power supply and temperature condition. As Vcc–Vss increases, the worst speedpath may need less time to evaluate, and the oscillator frequency may proportionately increase to keep track. On the other hand, as Vcc–Vss decreases, the worst speedpath may require more evaluation time and that increases in time may be provided by the slower oscillator frequency. As a result, the instantaneous oscillator frequency may track the worst speedpath, thus ensuring functionality over any (voltage, temperature) condition. Some amount of margin may counter any locally uncorrected noise in voltage and temperature.

One alternate mode may employ the PLL as a clock source. This allows testing of the microprocessor in the traditional synchronous mode, in which machine behavior is predictable on a cycle-by-cycle basis.

The preceding arrangements and embodiments have been described in U.S. patent application Ser. No. (Attorney Docket No. 219.41237X00), filed simultaneously with this application. The following embodiments may be pursued in this patent application, although these embodiments are also applicable and combinable with the embodiments and features described above As discussed above, a free-running oscillator may be used to run the microprocessor core and may extract a maximum performance. However, a microprocessor having a rated frequency may be more marketable. Thus, while the instantaneous frequency may be allowed to wander while the processor tracks the power supply noise, a microprocessor may also have a rated average frequency that reflects its average performance. This may be accomplished by a voltage ID (VID) mechanism where commands may be sent to an external voltage regulator module (VRM) to increase or decrease the voltage level (Vcc) supplied to the processor (i.e., the core). The power supply may therefore be used as the control voltage. This may allow the processor to throttle the voltage (and therefore the frequency) automatically and in an efficient manner. The throttling mechanisms (e.g. thermal, performance, reliability) may be simplified to a centralized control.

Embodiments of the present invention may allow the core operating in the asynchronous mode to be frequency governed to a constant average frequency and thereby run at a constant (i.e., unthrottled) performance. This may allow speed grading of parts during manufacturing. This may also allow continuous binning in which the bin size is arbitrary. This differs from disadvantageous arrangements in which the bin size may be limited by fixed bus ratio steps as allowed by a PLL circuit. Furthermore, a spread spectrum may be imparted on the oscillator by introducing a suitable modulation. Further, the power/reliability/performance may allow longer battery life (such as for laptops) while extending performance (such as for desktop computers) by converting surplus into higher frequency/voltage.

Figure 12:
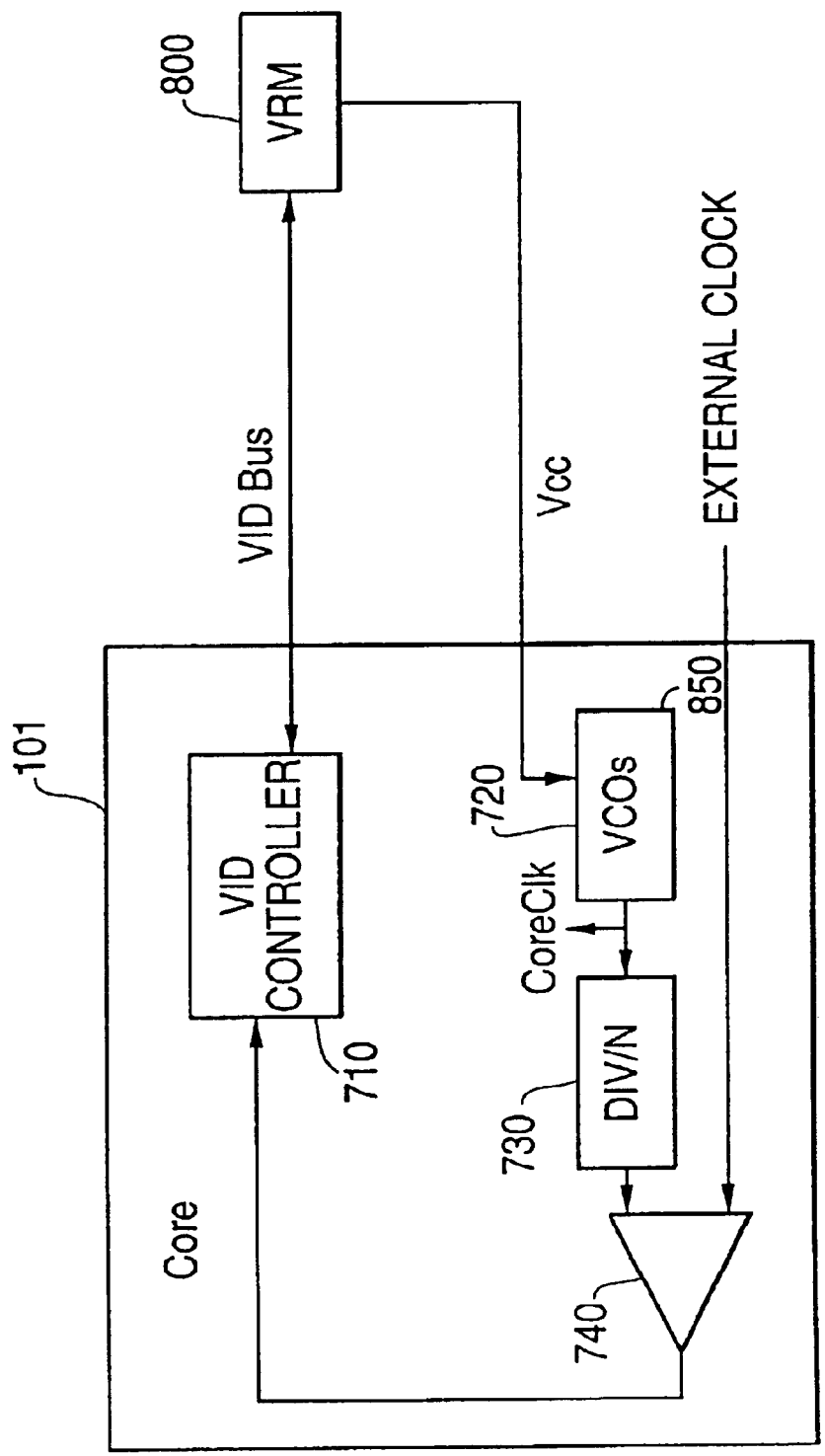
FIG. 12 is a diagram showing a voltage ID mechanism according to an example embodiment of the present invention.

Embodiments of the present invention may provide a frequency control circuit that includes a mechanism (such as a VID mechanism) to adjust a frequency of clock signals output from a plurality of distributed oscillators by using a supply voltage, which is the same voltage signal used to power critical components on-die. That is, the supply voltage (Vcc) is used as the voltage signal for the plurality of distributed oscillators. The frequency control circuit may control the frequency of circuit components that operate at a frequency dependent on a power supply voltage FIG. 12 shows an example of a VID mechanism according to an example embodied in the present invention. Other embodiments and configurations are also within the scope of the present invention. The VID mechanism may also be referred to as a VID controlled frequency (VCF) mechanism (or frequency control circuit). More specifically, FIG. 12 shows a VID controller 710, a divide-by-N circuit 730 and a comparator circuit 740 provided within the core 101. The VID controller 710, the divide-by-N circuit 730 and the comparator device 740 operate along with a voltage regulator module (VRM) 800 (located external to the core 101) and a plurality of distributed oscillators (VCOs) 850 to form a closed loop feedback system. The VCOs 850 may correspond to the plurality of ring oscillators provided about a clock distribution network discussed above. Each of the stages (such as the inversion stages) of the VCOs 850 may be CMOS technology so that the components track the power supply and temperature in the same fashion as the core database logic. That is, each oscillator may be directly connected to Vcc as shown in FIG. 12 (and through a power distribution network). Embodiments of the present invention may employ Vcc as a control voltage to each of the VCOs 850 via the power distribution network. Components other the VCOs 850 may be powered by Vcc.

The closed loop feedback system may be obtained by the VID controller 710 issuing a VID to the VRM 800, which in turn outputs the corresponding Vcc level. The Vcc may be translated to the correct frequency in the core clock. That is, the core clock may be regulated such that the average frequency is N times the external clock. This may be accomplished using the divide-by-N circuit 730.

FIG. 12 shows an external clock (or system clock) may be input to the core (such as the core 101) and input to the comparator device 740 (such as a frequency comparator). Another input of the comparator device 740 may be a signal based on the core clock signals (output from the ring oscillator circuits) that pass through the divide-by-N circuit 730. The comparator device 740 outputs a signal to the VID controller 710 based on the input signals. The VID controller issues a VID to the VRM 800. The VRM 800 outputs the correct Vcc level to the power distribution network so as to power components of the distributed ring oscillators (or other components) as well as to power other components (such as elements or logic) located on-die. Based on the received power signals, the VCOs 850 output core clock signals via the clock distribution network as discussed above. The signals may be input to the divide-by-N circuit 730 and pass to the comparator device 740. This closed loop feedback system thereby controls a frequency of the core clock signals on the clock distribution network by controlling the voltage to the VCO's 850. Accordingly, a frequency control circuit may monitor the frequency of the core clock and adjust the power supply to the VCOs 850 via the power distribution network. This adjusts the frequency of the core clock. As described above, each component of the VCOs 850 may be very sensitive to the environment such as temperature and voltage.

The VID controller 710 may output the VID as a digital code along signal lines of the VRM 800. These signals may be parallel signals (such as five bits, for example). The signals may also be serially sent from the VID controller 710 to the VRM 800. Serial VID is described in U.S. patent application Ser. No. 09/895,062 filed Jun. 29, 2001. The VID controller 710 may be a digital circuit on-die that decides the VID code to drive the VRM 800. A VID table may specify the digital code versus the analog Vcc voltage to the supplied VRM 800. The processor may decide which VID to send to the VRM 800.

Embodiments of the present invention may also include a temperature sensor provided about the VCOs 850 (or other component) to measure the operating temperature (Tj). The system may also be configured such that the VID controller 710 outputs the VID to the VRM 850 based on the sensed temperature and a desired temperature. Further, the VID controller 710 may provide the VID as a function of the temperature and/or the frequency. Operations further relating to the setting of the operating frequency based on the operating temperature and an operating voltage are provided in U.S. patent application Ser. No. (Attorney Docket No. 42390. P14325), filed simultaneously herewith, and entitled "Altering Operating Frequency And Voltage Set Point Of A Circuit In Response To The Operating Temperature And Instantaneous Operating Voltage Of The Circuit."

According to embodiments of the present invention, the frequency control circuit may operate in a frequency maximizing mode and/or a power minimizing mode. Other modes of operation are also within the scope of the present invention. In a frequency maximizing mode, the frequency control circuit may direct the voltage regulator (such as the VRM 800) to increase the Vcc to a maximum allowed by the presently sensed temperature on the processor (such as about the VCOs 850). In a power minimizing mode, the frequency control circuit may reduce the Vcc as long as a minimum target frequency is met. This mode may utilize only enough power to attain the target frequency. The reduced Vcc will conserve power.

Embodiments of the present invention may also include a software selectable mode switch. The operating system may decide when performance or power is more important and operate the switch to the respective mode. The operating system may decide to go into low power mode, and also to change the target frequency, thereby allowing an even lower Vcc, Fmax and power.

Embodiments of the present invention may also include software selectable speed targets. A speed target charges the frequency that a component (such as a processor) was originated for. There may be programmable limits on those speed targets. For example, speed targets such as 2×, 1×, 0.75×, and 0.5× may be available. That is, if a component was a 5 GHz component, then a 2× target implies 10 GHz. The component may deliver the highest frequency it is able to given the present temperature (and derivatively, the present Vcc). A 0.5× speed target may cause a 5 GHz component to attempt to slow down to 2.5 GHz. The component may be unable to slow down this much by dropping to its minimum operating voltage. However, the component may go to an extremely low power condition. Other speed targets are also within the scope of the present invention.

Figure 13:
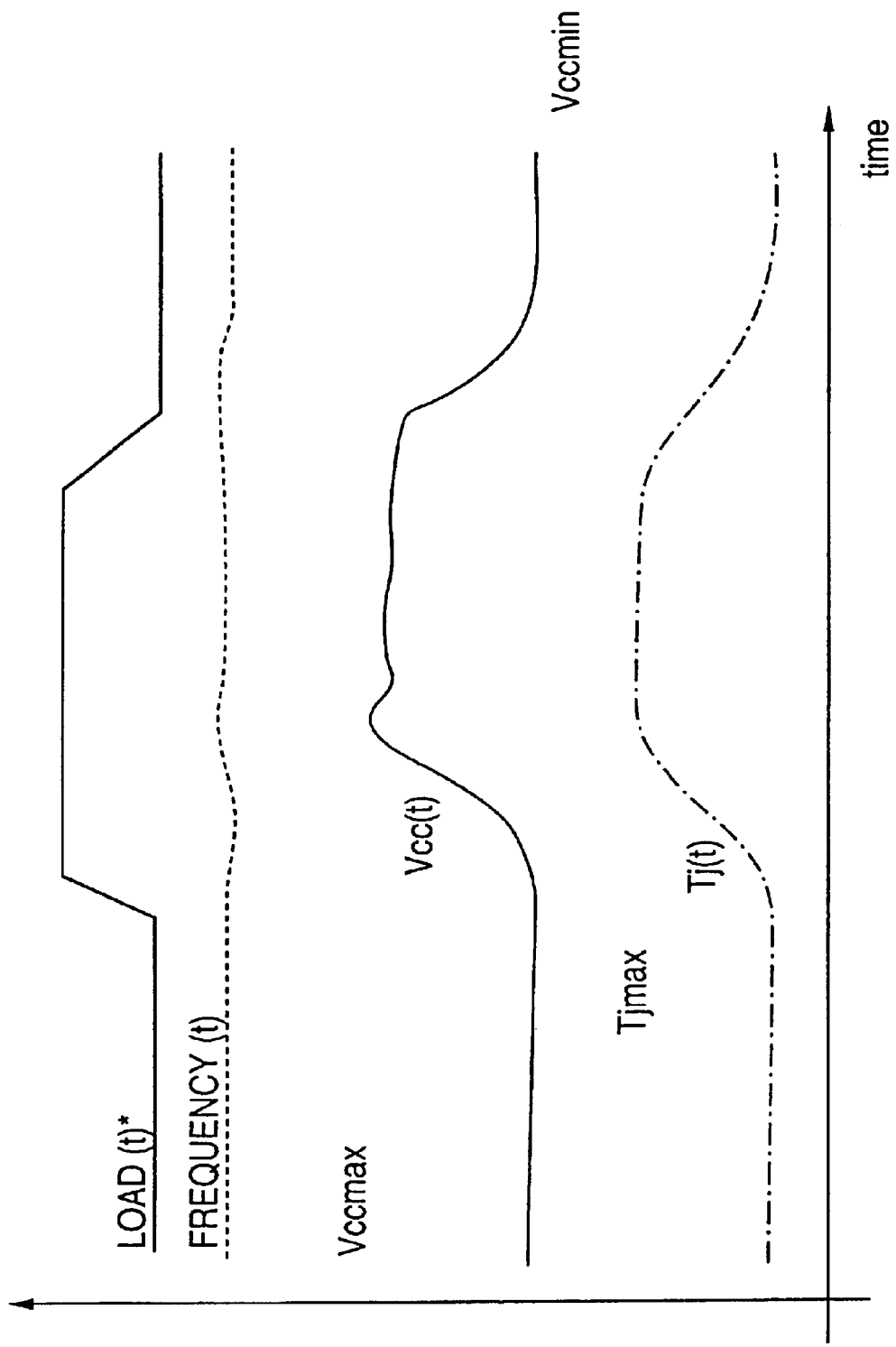
FIG. 13 is a graph showing Vcc and temperature performance over time.

FIG. 13 is a graph showing performance/power/reliability autothrottling according to an example embodiment of the present invention. Other embodiments are also within the scope of the present invention. More specifically, the graph shows how the Vcc and the temperature Tj(t) vary over time based on a load where the load current is proportional to activity in the processor. The Vcc(t) may be thermally limited near Vccmax. This graph shows that the Vcc and Tj may increase based on a load (or activity in the processor).

More specifically, FIG. 13 shows the ability of the processor to reach to load demands using temperature as a secondary control parameter. That is, as demand increases, activity increases, and silicon junction temperature (Tj) increases, which slows down the oscillators. The VFC loop may then force Vcc higher, which in turn increases Tj, thereby forcing Vcc higher, and Tj even higher until a maximum point is reached. The maximum point may be defined by an acceptable (Vcc, Tj) pair. The maximum point may represent the maximum performance that can be reliably and consistently extracted from the processor.

On the other hand, as the demand decreases, the VFC loop may quickly settle toward Vccmin. As Tj cools further, Vcc cannot be reduced below Vccmin anymore, and the Vcc loop will naturally force a higher core frequency. There are three options at this point. First, a higher core frequency may be allowed. The system may relay on Tj and core frequency to equilibrate while keeping Vcc=Vccmin. This option may result in a higher core frequency while activity/demand is low. As a second option, if low background performance is acceptable, then the ratio N may be reduced iteratively to reach a lower core frequency, until an equilibrium is reached whereby Vcc is slightly above Vccmin. As a third option, if an idle state is desired to reduce power further, then an override mechanism may disable the VFC loop and go into a sleep (i.e., stop clock) state.

Advantages of embodiments of the present invention will now be described. At the highest operating point, Vcc may be at its maximum, and correspond to the hottest junction temperature. This operating point may be limited by reliability. Rated performance may need to be guaranteed at this highest operating point. This maximum point may be dictated by maximum performance demand (or load current). As performance demand (or load current) decreases, the junction temperature cools. This may bring a temporary increase in the core frequency, which is counteracted by negative feedback to bring about a decrease in Vcc, thus maintaining constant average frequency. As performance demand decreases further, Vcc and temperature reduce hand in hand until the lowest load current state is reached.

Thus, negative feedback continually forces a Vcc, which is always just sufficient to sustain the rated core frequency, to a Vcc that is not too high (inefficiency) or too low (speedpath failure) for any valid temperature condition. There may be a rapid transfer from a highest performance point to a lowest performance point, thus conferring rapid energy delivery-on-demand (or energy conservation-on-demand) along an efficient transition curve. This efficiency may translate to a large increase in battery life for laptop or portable computers, for example.

In order to lock to a desired bus-to-core frequency ratio, the digital voltage frequency control (VFC) machine may count the internal core clocks and attempt to guide the internal core frequency to a long-term lock point that is a pre-determined ratio with respect to the external frequency. At lock, the VID may vary between two or more code values. This feedback may be performed with a slow time constant such that power supply droops (due to noise) are tracked by the oscillators. For example, quick first droops in the nanosecond scale may be addressed through instantaneous frequency tracking of the oscillators. This tracking may allow the core frequency to rise and fall in concert with supply noise, thus making the processor noise-tolerant, as its frequency is not limited by the lowest instantaneous Vcc level.

The bus-to-core frequency ratio may be very arbitrary. In PLL-based synchronous core designs according to disadvantageous arrangements, the ratio may be an integer, or a simple low integer fraction. According to an embodiment of the present invention, the ratio may take on any positive real number (even less than 1). This flexibility may enhance marketability.

A voltage monitor may ensure reliable operation at both the high and low ends. The highest operating point may be limited by reliability, which can be computed based on junction temperature, frequency, and voltage profiles. The average frequency may be known, the junction temperature may be reported from an on-die temperature sensor, and the voltage may be detected on-die (i.e., by a bandgap reference). By employing a digital calculator or the like, the optimal maximum supply voltage point may be extracted without sacrificing performance margin through conservative guardbanding. In other words, by computing the real-time usage of the part, taking into account derating due to non-100% loading, the maximum Vcc may be pushed higher to use up the reliability margin, thus converting it to more performance.

At the lowest operating point, the minimum Vcc may be usually determined to be the point at which functionality cannot be guaranteed due to finite headroom of certain circuits or increased variability of circuit performance. This Vcc minimum cutoff point may be used to force the core frequency to zero, thus entering a deep sleep powerdown state.

The voltage frequency control scheme may allow for deterministic power throttling states where the core frequency is throttled down from N to M, where M is lower than N, and is a fixed proportion of N. M can be deterministically picked such that the performance of the processor is not too much lower than its nominal ratio N such that it encroaches into the next lower frequency bar.

Embodiments of the present invention have been described with respect to a clock generating circuit, a clock distribution network and a power distribution network. The clock distribution network is intended to include clock distribution grids and clock distribution trees and their equivalence. The clock generating circuit and/or power distribution network may be provided in areas (other than the core) that include any type of clock distribution network and/or power distribution network.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An apparatus, comprising:
    logic components to execute functions;
    a voltage regulator module ("VRM") coupled to regulate a supply voltage to provide operational power to the logic components;
    a voltage controlled oscillator ("VCO") circuit coupled to receive the supply voltage, the VCO circuit to generate a clock signal for the logic components having a first frequency dependent upon a level of the supply voltage; and
    a frequency control circuit coupled to the VRM to select the level of the supply voltage.

2. The apparatus of claim 1, wherein the frequency control circuit includes a temperature sensor to sense a temperature about the VCO circuit, the frequency control circuit to select the level of the supply voltage based at least in part upon a present temperature sensed by the temperature sensor.

3. The apparatus of claim 1, wherein the VCO circuit comprises:

a plurality of distributed oscillators each coupled to receive the supply voltage from the VRM and to generate the clock signal dependent upon the supply voltage; and
    a clock distribution network coupled to the plurality of distributed oscillators to distribute the clock signal to the logic components.

4. The apparatus of claim 3, wherein each of the plurality of distributed oscillators includes a select circuit to select between a synchronous mode to drive the clock distribution network and an asynchronous mode to drive the clock distribution network.

5. The apparatus of claim 4, wherein the select circuit comprises a multiplexer coupled to output a feedback clock signal when the asynchronous mode is selected and coupled to output an external clock signal when the synchronous mode is selected.

6. The apparatus of claim 3, wherein the plurality of distributed oscillators comprises a plurality of distributed ring oscillators.

7. The apparatus of claim 6, further comprising a power distribution network to distribute the supply voltage to the plurality of distributed ring oscillators and to the logic components.

8. The apparatus of claim 2, wherein the logic components comprise core logic of a processor.

9. The apparatus of claim 8, further comprising a software selectable switch to select between at least a frequency maximizing mode and a power minimizing mode.

10. The apparatus of claim 1, further comprising:
    a divide-by-N circuit coupled to receive the clock signal from the VCO circuit and to generate a divide signal having a second frequency substantially equal to the first frequency divided by N; and
    a comparator coupled to receive the divide signal and an external clock signal, the comparator to generate a feedback signal based on a comparison of the divide signal and the external clock signal, the frequency control circuit coupled to receive the feedback signal and to select the level of the supply voltage at least in part upon the feedback signal.

11. The apparatus of claim 10, wherein the comparator comprises a frequency comparator.

12. The apparatus of claim 10, wherein the frequency control circuit comprises a voltage ID ("VID") controller coupled to control the VRM via a VID bus.

* * * * *